United States Patent
Nagatsuka et al.

(10) Patent No.: US 7,723,666 B2
(45) Date of Patent: May 25, 2010

(54) PHOTODIODE ARRAY CONFIGURED TO INCREASE ELECTRICAL OUTPUT POWER AND OPTICAL MICROWAVE TRANSMISSION SYSTEM RECEIVER UTILIZING THE SAME

(75) Inventors: Tsutomu Nagatsuka, Tokyo (JP); Yoshihito Hirano, Tokyo (JP); Tomohiro Akiyama, Tokyo (JP); Ryuji Ishii, Tokyo (JP); Masahito Sato, Tokyo (JP); Toshitaka Aoyagi, Tokyo (JP); Eitaro Ishimura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 380 days.

(21) Appl. No.: 11/884,205

(22) PCT Filed: May 2, 2005

(86) PCT No.: PCT/JP2005/008295

§ 371 (c)(1),
(2), (4) Date: Aug. 13, 2007

(87) PCT Pub. No.: WO2006/120723

PCT Pub. Date: Nov. 16, 2006

(65) Prior Publication Data
US 2009/0121118 A1    May 14, 2009

(51) Int. Cl.
*H01J 40/14* (2006.01)

(52) U.S. Cl. .................................. 250/214 R; 250/205

(58) Field of Classification Search ............ 250/214 R, 250/214.1, 208.1, 205; 342/368, 369; 343/703, 343/721; 398/183, 186
See application file for complete search history.

(56) References Cited

U.S. PATENT DOCUMENTS 6,414,566 B1   7/2002   Atokawa et al.
7,442,912 B2 * 10/2008  Wada et al. ............. 250/214 R

FOREIGN PATENT DOCUMENTS

| JP | 08-331061 A | 12/1996 |
| JP | 11-154762 A | 6/1999 |
| JP | 2001-68717 A | 3/2001 |
| JP | 2001-189488 A | 7/2001 |
| JP | 2004-328903 A | 11/2004 |
| WO | WO-01/43203 A1 | 6/2001 |

OTHER PUBLICATIONS

Goldsmith, C.L., et al., IEEE Transaction on Microwave Theory and Techniques, vol. 45, No. 8, 1997, pp. 1342-1350.

* cited by examiner

*Primary Examiner*—Que T Le
(74) *Attorney, Agent, or Firm*—Birch, Stewart, Kolasch & Birch, LLP

(57) ABSTRACT

Provided is a photodiode array that is capable of outputting an electric signal with a large electric power and an optical microwave transmission system receiver that supplies an electric power with the aid of an optical fiber and does not require the electric power line from the external. An input modulation light is branched and input to a plurality of photodiode elements (1), electric output terminals (5) of the plurality of photodiode elements (1) are connected in parallel to each other, and a combined electric output is extracted. The electric output terminal (5) of the photodiode array configured as described above is connected to an antenna (7) without an intermediation of an amplifier circuit.

5 Claims, 2 Drawing Sheets

PHOTODIODE ARRAY CONFIGURED TO INCREASE ELECTRICAL OUTPUT POWER AND OPTICAL MICROWAVE TRANSMISSION SYSTEM RECEIVER UTILIZING THE SAME

TECHNICAL FIELD

The present invention relates to a photodiode array and an optical microwave transmission system receiver in which a plurality of photodiodes are connected in parallel to each other, thereby enabling a large electric power to be output.

BACKGROUND ART

A photodiode has been widely employed as a photodetector that operates at high speed in an optical transmission device. Similarly, in an optical fiber radio communication device, the photodiode is essential as a key device. The optical fiber radio communication device is a transmission device having various advantages by which the transmission of a broad band and high capacity is enabled, various processor circuits can be downsized because the wavelength of light is short, a transmission loss is very low, and an electromagnetic interference is extremely reduced.

In the optical fiber radio communication device, light is modulated according to an RF electric signal and transmitted, and the modulated light is detected by a photodiode, to thereby reproduce an original RF electric signal. The reproduced RF electric signal is transmitted to a succeeding processor circuit or radiated toward a space by means of an antenna.

In general, an electric signal that is output from the photodiode is very weak. For that reason, when the electric signal that is extracted from the photodiode is transmitted to a circuit at a post-stage, it is necessary to amplify the signal with the aid of an amplifier circuit such as amplifier. For example, even in a case where the signal that has been transmitted through the optical fiber radio communication is radiated toward the space from the antenna, it is necessary to provide an electric power for radiating the electric signal toward the space after the electric signal has been detected by the photodiode, so the electric signal needs to be amplified by means of an amplifier circuit.

However, a power supply is required in an amplifier circuit such as an amplifier involving a power consumption. In addition, a space for the amplifier circuit is required, so it is difficult to downsize the device. Further, an electric power line that supplies an electric power is required, and an electromagnetic interference occurs due to an electromagnetic field from the electric power line, thereby making it impossible to sufficiently utilize the features of the optical fiber radio communication device with no electromagnetic interference.

As a method of increasing the electric power of an output electric signal from a photodiode, there has been proposed a traveling wave photodiode (for example, refer to Patent Document 1). This inputs a light to a plurality of photodiodes with a delay time bits by bits, and extracts output electric signals gradually with a delay time so as to cancel the delay time that has been given previously. However, in this method, since it is necessary to perfectly match those delay times with each other, and the impedance matching at the time of combining the electric powers is difficult, the output electric power that is actually obtained is not yet limited under the existing circumstances.

Patent Document 1: WO 2003-516641

DISCLOSURE OF THE INVENTION

Problems to be Solved by the Invention

As described above, in the conventional photodiode of this type, the output electric signal is very weak, so an amplifier circuit is required at a post-stage. There are disadvantages such as the upsized device, the increased power consumption, or the deteriorated non-electromagnetic interference.

The present invention has been made to solve the above-mentioned problems, and an object of the present invention is to provide a photodiode array that is capable of outputting an electric signal with a large electric power. Another object of the present invention is to provide an optical microwave transmission system receiver that supplies an electric power with the aid of an optical fiber and does not require the electric power line from the external.

Means for Solving the Problems

A photodiode array according to the present invention is characterized by branching an input modulation light, inputting the branched modulation lights to a plurality of photodiode elements, connecting electric output terminals of the plurality of photodiode elements in parallel to each other, and extracting a combined electric output.

Further, an optical microwave transmission system receiver according to the present invention is characterized in that the electric output terminal of the photodiode array is connected to an antenna without an intermediation of an amplifier circuit.

Still further, an photodiode array according to the present invention is characterized by further including: converting means for converting a light signal that is transmitted through an optical fiber into an electric energy to supply the photodiode array with the electric energy as a bias power supply.

Yet further, an photodiode array according to the present invention is characterized by further including: accumulating means for accumulating the electric energy that has been converted by the converting means to supply the photodiode array with the accumulated electric energy as a bias power supply.

In addition, the optical microwave transmission system receiver according to the present invention is characterized in that the photodiode array is used therein, and there is no electric power line from the external.

EFFECTS OF THE INVENTION

According to the present invention, there can be obtained a photodiode array that is capable of outputting the electric signal with high power, and also there can be obtained an optical microwave transmission system receiver that supplies an electric power with the aid of the optical fiber and does not require the electric power line from the external at all.

BEST MODES FOR CARRYING OUT THE INVENTION

Embodiment 1

Figure 1:
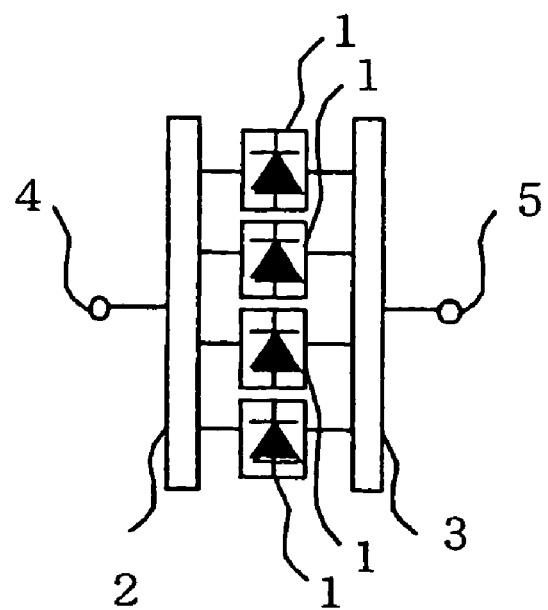
FIG. 1 is a diagram showing a photodiode array according to Embodiment 1 of the present invention.

FIG. 1 is a diagram showing a photodiode according to Embodiment 1 of the present invention. As shown in FIG. 1, a plurality of photodiode elements 1 are arranged to form a photodiode array. A modulated light that has been input to a light input terminal 4 is branched by an optical branching filter circuit 2, and then input to the plurality of photodiode elements 1. Electric signals that have been detected by the photodiode elements 1 are combined together by an electric power combining circuit 3, and output from an electric output terminal 5.

Referring to FIG. 1, transmission paths of the light which is branched by the optical branching filter circuit 2 and input to the plurality of photodiode elements 1 are substantially identical in the length with each other as compared with the order of the wavelength of the modulated microwave over all of the paths.

Accordingly, the electric signals that have been detected by the plurality of photodiode elements 1 are combined in electric power at the substantially same phase, and output from the electric output terminal 5. For that reason, the electric powers that are output from the respective photodiode elements 1 are efficiently combined together, thereby enabling a large electric power to be obtained.

In general, when the photodiodes are not saturated, an RF current $I_{PD}$ of the current signals that are output from the photodiodes is represented by the following Expression 1.

[Ex. 1]

$$I_{PD} = \frac{\eta P_{CW} m}{2} \quad (1)$$

In this expression, $\eta$ is a quantum efficiency, $P_{cw}$ is an input light power (a mean value of the modulated light power), and m is a modulation degree. The RF electric power $P_{PD}$ that is obtained when the output current is connected to the output circuit having an impedance $Z_o$ is represented by the following Expression 2.

[Ex. 2]

$$P_{PD} = Z_O I_{PD}^2 = Z_O \frac{\eta^2 P_{CW}^2 m^2}{4} \quad (2)$$

Accordingly, the electric power of the RF electric output that is output from the photodiodes increases in proportion to the second power of the power of the light that is input to the photodiodes. This means that the electric output power can be remarkably increased as the light that is input to the photodiodes is increased.

In the photodiode array shown in FIG. 1, when the plurality of photodiode elements 1 are used, the respective photodiode elements 1 are prevented from being saturated even if the high-power light is input. For that reason, the large output RF electric power can be obtained. Also, the input light power is increased, thereby making it possible to obtain the output RF electric power larger than the input light power. In addition, the photodiode array shown in FIG. 1 has the advantage in that the large output power can be readily obtained without any necessity to match the delay time or match the output impedances of the respective elements as in the conventional traveling wave photodiode.

In other words, the output electric signal power $P_{PD}$ is in proportion to the second power of a mean value $P_{CW}$ of the input modulated light power through Expression 2. Therefore, the output electric signal power $P_{PD}$ is always made larger than the mean value $P_{CW}$ of the input modulated light power when the mean value $P_{CW}$ of the input modulated light power is increased to be a specific value or more, from the above expression.

However, in the conventional photodiode, when the mean value $P_{CW}$ of the modulated light power is increased, the photo diodes are saturated, and Expression 2 is not satisfied. For that reason, it is actually difficult to make the output electric signal power $P_{PD}$ larger than the power value $P_{CW}$ of the modulated light power.

In the photodiode array shown in FIG. 1, since a plurality of photodiode elements 1 are connected in parallel, Expression 2 is satisfied as it is even if the mean value $P_{CW}$ of the modulated light power is made larger without saturating the respective photodiode elements 1. Accordingly, it is possible to make the output electric signal power $P_{PD}$ larger than the mean value $P_{CW}$ of the input modulated light power.

Embodiment 2

Figure 2:
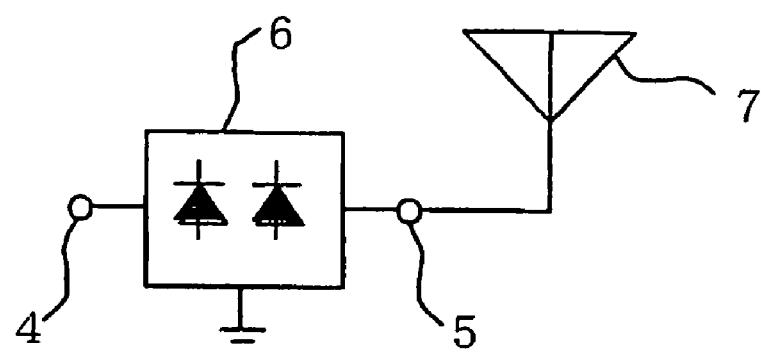
FIG. 2 is a diagram showing an optical microwave transmission system receiver according to Embodiment 2 of the present invention.

FIG. 2 is a diagram showing an optical microwave transmission receiver according to Embodiment 2 of the present invention.

In the optical microwave transmission receiver shown in FIG. 2, a photodiode array 6 having the same configuration as that in Embodiment 1 shown in FIG. 1 is input with a light modulated signal from the light input terminal 4. The light modulated signal is detected by the photodiode array 6 and output from the electric output terminal 5 as the RF electric signal. In addition, the RF electric signal is input to an antenna 7 and radiated toward a space as the electromagnetic wave from the antenna 7.

In the optical microwave transmission receiver shown in FIG. 2, the electric signal that is output from the photodiode array 6 is connected directly to the antenna 7 without being input to the amplifier circuit such as an amplifier. The reason is that the electric signal can be radiated directly from the antenna 7 since the electric power of the electric signal that is output from the photodiode array 6 is sufficiently large, unlike the conventional art. For that reason, the amplifier circuit required up to now is not required with the results that not only the device can be downsized, but also it is unnecessary to supply a required electric power to the amplifier circuit, to thereby reduce the power consumption. Also, since the electric power line that supplies the electric power to the amplifier circuit is not required, there is advantage in that there is no electromagnetic interference that occurs through the electric power line, and the low electromagnetic interference characteristic inherent to the optical fiber radio communication can be obtained.

FIG. 2 shows a case in which the output of the photodiode array 6 is connected directly to the antenna 7. However, the present invention is not limited to this configuration, but a passive circuit such as a filter or a branching filter can be inserted between the photodiode array 6 and the antenna 7. Also, a branching such as a branching filter or a circulator can be disposed to add a circuit for a signal that is received from the antenna 7. Similarly, this case can obtain the advantages of the present invention.

Embodiment 3

Figure 3:
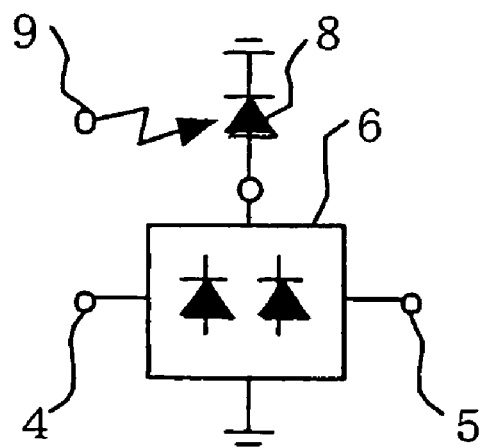
FIG. 3 is a diagram showing a photodiode array according to Embodiment 3 of the present invention.

FIG. 3 is a diagram showing a photodiode array according to Embodiment 3 of the present invention. The photodiode array 6 shown in FIG. 3 detects, as in Embodiments 1 and 2, a light modulation signal that is input from the light input terminal 4, and outputs the light modulation signal from the electric output terminal 5 as the RF electric signal. In addition, the photodiode array 6 shown in FIG. 3 is connected with an electric power supply photodiode 8 via a bias.

The electric power supply photodiode 8 constitutes electric power converting means for converting the light that has been input to an electric power supply light input terminal 9 by the optical fiber into an electric energy to supply the converted electric energy to the photodiode array 6 as a bias power supply.

For that reason, the power of the photodiode itself can be supplied by light, and the photodiode that does not require at all an internal power supply or the electric power supply from the external is obtained. For that reason, there can be obtained a high-power photodiode that does not suffer at all from a problem with the size or weight of the power supply circuit or the electric power line, or a problem with the electromagnetic interference.

Embodiment 4

Figure 4:
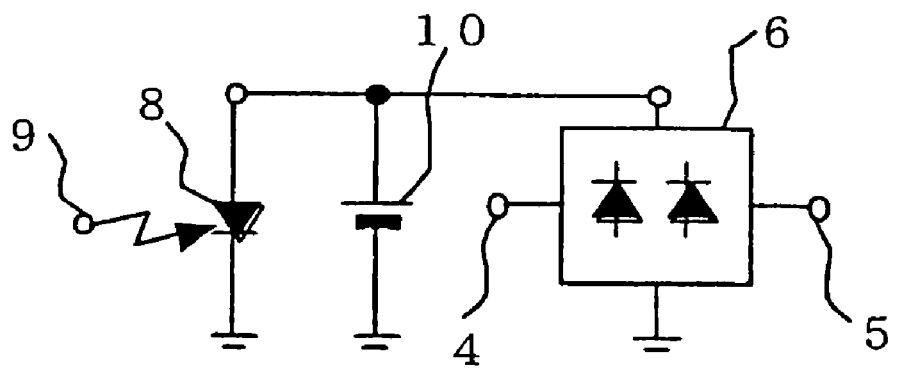
FIG. 4 is a diagram showing a photodiode array according to Embodiment 4 of the present invention.

FIG. 4 is a diagram showing a photodiode array according to Embodiment 4 of the present invention. The photodiode array 6 shown in FIG. 4 is the same configuration as that in Embodiment 1 shown in FIG. 1, and inputs a light modulation signal from the light input terminal 4. The light modulation signal is detected by the photodiode array 6, and output from the electric output terminal 5 as an RF electric signal.

Also, the electric energy that has been converted by the electric power supply photodiode 8 is supplied as the bias power supply and operates, as in Embodiment 3 shown in FIG. 3. In this case, the electric energy that is generated by the electric power supply photodiode 8 is temporarily accumulated in an accumulator 10 as accumulating means, and thereafter supplied to the photodiode array 6 as the bias power supply.

For that reason, even if the magnitude of the electric power of the light that is input to the electric power supply photodiode 8 varies, the stable bias power supply can be supplied to the photodiode array 6, thereby making it possible to obtain the photodiode array that stably operates.

The above embodiment shows a case in which the electric power supply photodiode 8 is used in order to obtain the electric power energy that is supplied to the photodiode array 6. However, the present invention is not limited to the above-mentioned configuration, and the electric power energy can be obtained by a solar cell instead of the photodiode. Similarly, in this case, the photodiode array 6 that operates only with the aid of light can be obtained.

Also, when the above-mentioned photodiode array 6 is applied to the optical microwave transmission system receiver, there is advantage in that the optical microwave transmission system receiver that is downsized, low in the power consumption, and extremely small in the electromagnetic interference can be obtained.

The invention claimed is:

1. A photodiode array device comprising:
a plurality of photodiode elements;
an optical branching circuit which branches an input modulation light, and distributes the branched modulation light to the plurality of photodiode elements; and
an electric power combining circuit which connects electric output terminals of the plurality of photodiode elements in parallel to each other, and extracts a combined electric output to be output via an electric output terminal of the device.

2. An optical microwave transmission system receiver comprising the photodiode array device of claim 1, wherein the electric output terminal of the device is connected to an antenna without an intermediation of an amplifier circuit.

3. A photodiode array device according to claim 1 further comprising: converting means for converting a light signal that is transmitted through an optical fiber into an electric energy to supply the electric energy to the plurality of photodiode elements as a bias power supply.

4. A photodiode array device according to claim 3 further comprising: accumulating means for accumulating the electric energy that has been converted by the converting means to supply the accumulated electric energy to the plurality of photodiode elements as a bias power supply.

5. An optical microwave transmission system receiver comprising the photodiode array device according to claim 3.

* * * * *